United States Patent
Seto et al.

(10) Patent No.: US 7,081,659 B2
(45) Date of Patent: Jul. 25, 2006

(54) SEMICONDUCTOR APPARATUS HAVING A BUILT-IN ELECTRIC COIL AND A METHOD OF MAKING THE SEMICONDUCTOR APPARATUS

(75) Inventors: Masami Seto, Hyogo-ken (JP); Toshihiko Taneda, Hyogo-ken (JP)

(73) Assignee: Ricoh Company, Ltd., Kanagaway (JP)

( * ) Notice: Subject to any disclaimer, the term of this patent is extended or adjusted under 35 U.S.C. 154(b) by 0 days.

(21) Appl. No.: 11/239,359

(22) Filed: Sep. 30, 2005

(65) Prior Publication Data
US 2006/0060939 A1   Mar. 23, 2006

Related U.S. Application Data

(62) Division of application No. 10/329,493, filed on Dec. 27, 2002, now Pat. No. 6,977,403.

(30) Foreign Application Priority Data
Jan. 8, 2002   (JP)   .............................. 2002-001837

(51) Int. Cl.
*H01L 29/82* (2006.01)
(52) U.S. Cl. ...................... 257/421; 257/299; 257/422; 257/355; 257/533; 257/E43.004; 257/E29.323; 257/E29.167; 438/957
(58) Field of Classification Search ................ 257/421, 257/422, 425, 427, 299, 355, 533, E43.004, 257/E29.167, E29.323; 438/3, 957
See application file for complete search history.

(56) References Cited

U.S. PATENT DOCUMENTS 5,738,931 A    4/1998  Sato et al.
2001/0055819 A1  12/2001  Webster

FOREIGN PATENT DOCUMENTS

JP    2000260910    9/2000

OTHER PUBLICATIONS

Ricoh prior patent application No. AP90-242, U.S. Appl. No. 07/628,583, Us Appln. No. USA90-6285853, filed Dec. 17, 1990.

*Primary Examiner*—Minhloan Tran
*Assistant Examiner*—Tan Tran
(74) *Attorney, Agent, or Firm*—Dickstein Shapiro Morin & Oshinsky LLP

(57) ABSTRACT

A semiconductor apparatus includes lower conductive film strips, an inter-layer insulating layer, implanted conductive members, and upper conductive film strips. The lower conductive film strips are formed in a pattern closely adjacent in a line width orientation, electrically separated from each other. The inter-layer insulating layer is formed the lower conductive film strips. The implanted conductive members are implanted in connection holes formed in the inter-layer insulating layer at positions corresponding to both edge sides of the lower conductive film strips. The upper conductive film strips are formed on the implanted conductive members and the inter-layer insulating layer to connect the lower conductive film strips in series so that the lower conductive film strips, the implanted conductive members, and the upper conductive film strips form an electric coil.

9 Claims, 10 Drawing Sheets

SEMICONDUCTOR APPARATUS HAVING A BUILT-IN ELECTRIC COIL AND A METHOD OF MAKING THE SEMICONDUCTOR APPARATUS

This application is a divisional application of U.S. patent application Ser. No. 10/329,493, filed Dec. 27, 2002 now U.S. Pat. No. 6,977,403, the entirety of which is incorporated herein by reference.

BACKGROUND OF THE INVENTION

1. Field of the Invention

The present invention relates to semiconductor apparatuses and method of making such apparatuses. More particularly, the invention relates to a semiconductor apparatus having a built-in electric coil and a method of making the semiconductor apparatus.

2. Discussion of the Background

As miniaturization of electronic equipment is advanced, power source apparatuses such as a step-up DC-DC converter for supplying power to such equipment are miniaturized, particularly into a low-profile package. FIG. 1 shows a block diagram of an exemplary circuit applied to a background step-up DC-DC converter 101. As shown in FIG. 1, the background step-up DC-DC converter 101 includes an IC component 103, an electric coil 105, a Schottky diode 107, and capacitors 109 and 111. It also includes a circuit board (not shown) having a circuit pattern therein for electrically connecting these components to each other. The IC component 103, which is a semiconductor apparatus, includes a switch 113 including an N-channel field-effect transistor (FET) and a control circuit 115 for controlling the switching operations of the switch 113.

The step-up DC-DC converter 101 charges an energy in the electric coil 105 when the switch 113 is turned on, and discharges the energy from the electric coil 105 by overlaying the energy on an input voltage ($V_{in}$) when the switch 113 is turned off. Thus, an output voltage ($V_{out}$) higher than the input voltage ($V_{in}$) is output. The control circuit 115 adjusts a time ratio of the switch 113 to make the output voltage ($V_{out}$) constant. The time ratio is a ratio of a time period when the switch 113 is turned on to a full cycle of the switching operation of the switch 113.

Some DC-DC converters are increasingly required to be driven at a frequency of 1 MHz or greater to achieve a miniaturization of the apparatus, as often required to those for small-sized electronic equipment. Under the circumstances, the electric coil is one of key factors and is needed to satisfy requirements of a small size, a superior frequency characteristic, and an appropriate electrical power capacity.

Recently, a low-profile and miniaturized IC chip has been developed with the advent of a wafer-level chip size package (CSP) technique with which pads in an array form are prepared on a wafer before the IC components are cut up. For example, Japanese Laid-Open Patent Application Publication, No. 2000-260910, describes the wafer-level CSP.

Referring to FIG. 2, a background manufacturing method with respect to the wafer-level CSP is explained. As shown in FIG. 2, in the background manufacturing method, a base insulating film 3 is formed on a semiconductor substrate 1 and a semiconductor element (not shown) such as a transistor is formed therein. After that, a lower insulating layer 5 composed of a boro-phospho silicate glass (BPSG) film is formed relative to the entire surface of the semiconductor substrate 1. The lower insulating layer 5 is provided with a plurality of connection holes (not shown) therein. Then, the lower insulating layer 5 is provided with an Al distribution (not shown) and an Al electrode pad 23.

The lower insulating layer 5 and the Al electrode pad 23 are covered by a passivation film including a phospho silicate glass (PSG) film 9 as a lower layer and a silicon nitride (SiN) film 11 as an upper layer. The passivation film comprising PSG film 9 and SiN film 11 is one of inter-layer insulating layers. Further, a polyimide layer 16 is formed on the passivation film comprising PSG film 9 and SiN film 11. A pad opening 25 is formed in the insulating layer above the Al electrode pad 23 in order to have an electrical connection with a metal distribution layer formed in a later process and to allow a probe to contact the Al electrode pad 23 during a wafer test in a later process.

Then, in the background manufacturing method, the wafer test is performed in which the probe is contacted with the Al electrode pad 23.

A barrier metal layer 18 comprising chromium and an electrode layer comprising copper for soldering (not shown) are formed relative to the entire surface of the semiconductor substrate 1, by a sputtering deposition. The barrier metal layer 18 is located between a copper-comprising metal distribution layer formed in a later process and the Al electrode pad 23 to prevent mutual invasion at that location.

A photoresist pattern (not shown) is formed over a predetermined region on the electrode layer. Subsequently, a Cu distribution layer 27 and a Cu electrode pad 29 are formed by soldering and electrolytic plating. The Cu distribution layer 27 and the Cu electrode pad 29 are referred to as a redistribution layer. Conventionally, the redistribution layer generally comprises copper because copper provides high mechanical strength and high reliability in terms of moisture resistance.

After removal of the photoresist pattern, unnecessary portions of the soldering electrode layer and the barrier metal layer 18 are removed with masks of the Cu distribution layer 27 and the Cu electrode pad 29 using a wet etching. Then, a metal layer is formed by sputtering deposition and electrolytic plating. Subsequently, the metal layer is patterned by photoengraving and etching to form a metal post 31 on the Cu electrode pad 29.

Then, the wafer, an encapsulation resin 21, and a temporal film (not shown) are placed in a mold tool (not shown) for encapsulation with the encapsulating resin 21. The temporal film is a material for preventing contact of the encapsulating resin 21 to the mold tool. Then, heat and pressure are applied to the mold tool to an extent that the metal post 31 is projected from an encapsulating resin 21. Subsequently, a barrier metal layer 33 is formed on the surface of the metal post 31. Then, a solder sphere 35 is mechanically fixed to the metal post 31 of the wafer encapsulated by the encapsulating resin 21, through the barrier metal layer 33. As a final process, the wafer is cut up into individual chips.

Because of resin encapsulation at the wafer level, the number of manufacturing processes is reduced and miniaturization of chip size is achieved.

However, the background DC-DC converter still has a thick profile even though the IC component of the DC-DC converter is made thin. This is because the electric coil in the background DC-DC converter is fixed to the rear surface of the circuit substrate. In addition, there is a certain limit in making the circuit substrate thin and therefore it is difficult to further make a power source device, such as the DC-DC converter, thin.

SUMMARY OF THE INVENTION

In view of the foregoing, it is an object of the present invention to provide a novel semiconductor apparatus which includes a built-in electric coil while maintaining a ultra-low profile and a miniaturized size.

Another object of the present invention is to provide a novel DC-DC converter including a semiconductor apparatus which includes a built-in electric coil while maintaining a ultra-low profile and a miniaturized size.

Another object of the present invention is to provide a novel method of manufacturing a semiconductor apparatus which includes a built-in electric coil while maintaining a ultra-low profile and a miniaturized size.

To achieve these and other objects, in a preferred embodiment, a novel semiconductor apparatus includes a semiconductor substrate, a lower insulating layer, a plurality of lower conductive film strips, an inter-layer insulating layer, a plurality of implanted conductive members, and a plurality of upper conductive film strips. The semiconductor substrate is covered with a base insulating film. The lower insulating layer is coated on the base insulating film. The plurality of lower conductive film strips are arranged in a pattern closely adjacent and parallel to one another in a line width orientation. Every adjacent two of the lower conductive film strips are electrically separated from each other. The inter-layer insulating layer is formed on the lower insulating layer and the plurality of lower conductive film strips. The plurality of implanted conductive members are implanted in a plurality of connection holes formed in the inter-layer insulating layer at positions corresponding to both edge sides of the plurality of the lower conductive film strips. The plurality of upper conductive film strips are formed on the plurality of implanted conductive members and the inter-layer insulating layer connect an edge side of each one of the plurality of the lower conductive film strips to an opposite edge side of an adjacent one of the plurality of the lower conductive film strips through each one of the plurality of the implanted conductive members so that the plurality of lower conductive film strips are connected in series. In this structure, the plurality of lower conductive film strips, the plurality of implanted conductive members, and the plurality of upper conductive film strips form an electric coil.

The inter-layer insulating layer may be a multi-layered film including at least different two insulating layers. In this case, the semiconductor device further includes a magnetic member formed in the inter-layer insulating layer to an extent of a length covering the plurality of lower conductive film strips.

The inter-layer insulating layer may include a silicon dioxide film, a silicon nitride film, and one of photosensitive polyimide and photosensitive polybenz-oxazole layers, which are overlaid in this order from a bottom.

The magnetic member may be deposited on the silicon nitride film to an extent of a length to cover the plurality of lower conductive film strips, and may be made of materials including no ferrum.

The plurality of lower conductive film strips, the plurality of implanted conductive members, and the plurality of upper conductive film strips may be made of a same metal material.

The above-mentioned novel semiconductor apparatus may further include a metal electrode pad and a redistribution layer. The metal electrode pad is formed on the lower insulating layer in a region different from a region where the electric coil is formed, at a same time when the plurality of lower conductive film strips are formed. The redistribution layer is formed, filling an opening provided in the inter-layer insulating layer above the metal electrode pad and laying on the inter-layer insulating layer at a region different from the region where the electric coil is formed. The redistribution layer is formed at a same time when the plurality of implanted conductive members and the plurality of upper conductive film strips are formed. This semiconductor device is packaged at a wafer level.

The above-mentioned novel semiconductor apparatus may further include a switch connected in series to the electric coil and a control circuit for controlling switching operations of the switch.

The above-mentioned novel semiconductor apparatus may further include a voltage regulating circuit for regulating an input voltage to a constant voltage.

Further, to achieve the above-mentioned objects of the present invention, in an exemplary embodiment, a novel DC-DC converter includes any one of the semiconductor apparatuses defined above.

Further, to achieve the above-mentioned objects of the present invention, in an exemplary embodiment, a novel method of manufacturing a semiconductor device, comprising the steps of providing, coating, first forming, second forming, third forming, fourth forming, and fifth forming. The providing step provides a semiconductor substrate covered with a base insulating film. The coating step coats a lower insulating layer on the base insulating film. The first forming step forms a plurality of lower conductive film strips on the lower insulating layer in a pattern closely adjacent and parallel to one another in a line width orientation. Every adjacent two of the lower conductive film strips are electrically separated from each other. The second forming step forms an inter-layer insulating layer on the lower insulating layer and the plurality of lower conductive film strips. The third forming step forms a plurality of connection holes in the inter-layer insulating layer at positions corresponding to both edge sides of each one of the plurality of lower conductive film strips. The fourth forming step forms a plurality of implanted conductive members implanted in the plurality of connection holes. The fifth forming step forms a plurality of upper conductive film strips on the plurality of implanted conductive members and the inter-layer insulating layer to connect an edge side of each one of the plurality of the lower conductive film strips to an opposite edge side of adjacent one of the plurality of the lower conductive film strips through each one of the plurality of the implanted conductive members so that the plurality of lower conductive film strips are connected in series. In this semiconductor apparatus, the plurality of lower conductive film strips, the plurality of implanted conductive members, and the plurality of upper conductive film strips form an electric coil.

These and other features and advantages of the invention will be more clearly apparent from the following detailed ascription which is provided in connection with accompanying drawings and which illustrates exemplary embodiments of the invention.

DETAILED DESCRIPTION OF PREFERRED EMBODIMENTS

Figure 1:
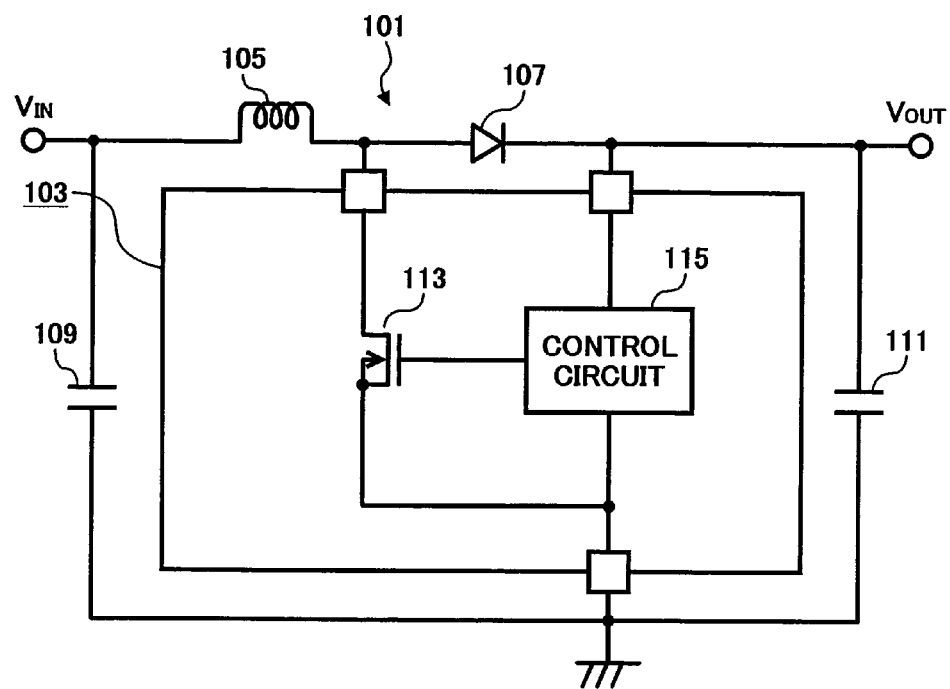
FIG. 1 is a schematic circuit diagram of a background step-up DC-DC converter made with a background method.
Figure 2:
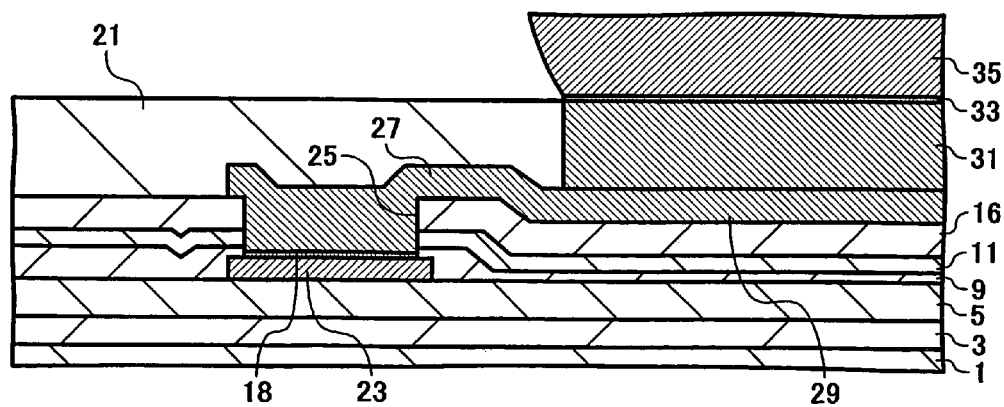
FIG. 2 is a schematic cross-section view of a major portion of a background wafer-level CSP.
Figure 3:
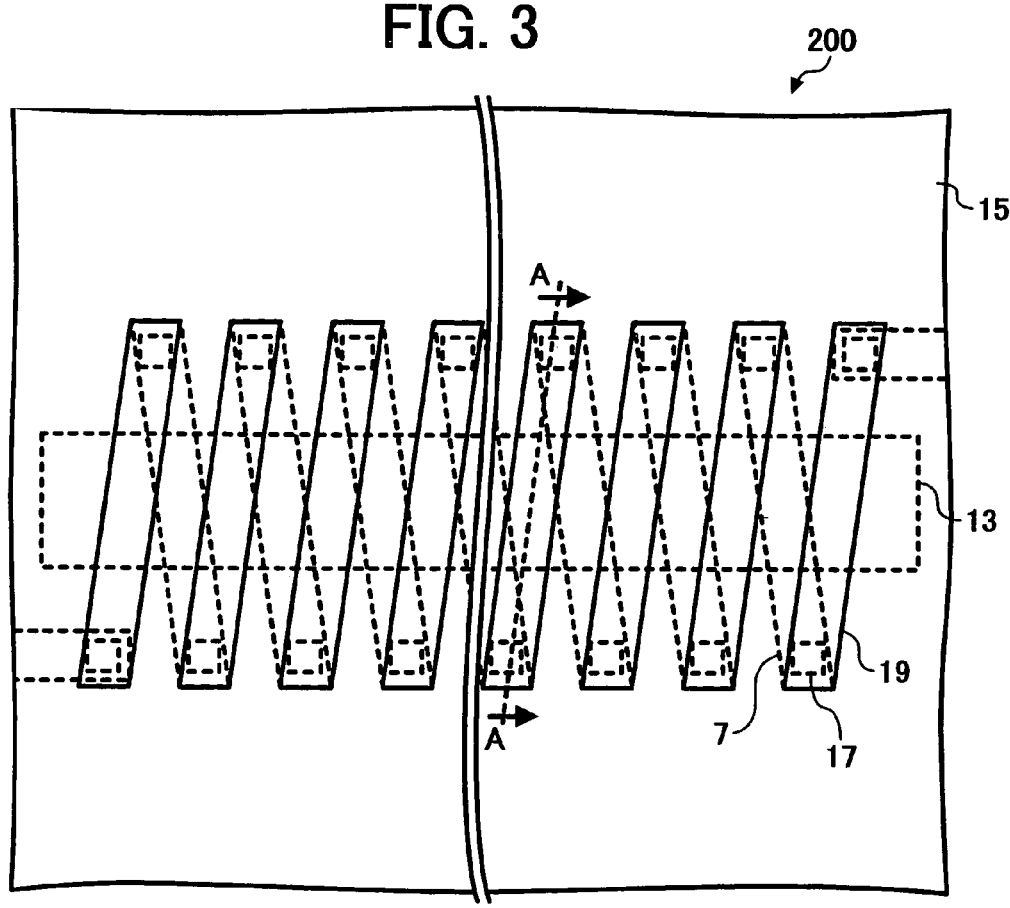
FIG. 3 is a schematic top view of an electric coil portion of a semiconductor apparatus according to a preferred embodiment of the present invention.

In describing preferred embodiments illustrated in the drawings, specific terminology is employed for the sake of clarity. However, the disclosure of this patent specification is not intended to be limited to the specific terminology so selected and it is to be understood that each specific element includes all technical equivalents that operate in a similar manner. Referring now to the drawings, wherein like reference numerals designate identical or corresponding parts throughout the several views, particularly to FIGS. 3 and 4, a semiconductor apparatus 200 according to a preferred embodiment is explained. FIG. 3 shows an electric coil portion of the semiconductor apparatus 200 and FIG. 4 shows a cross section of the semiconductor apparatus 200 taken on line A—A of FIG. 3.

Figure 4:
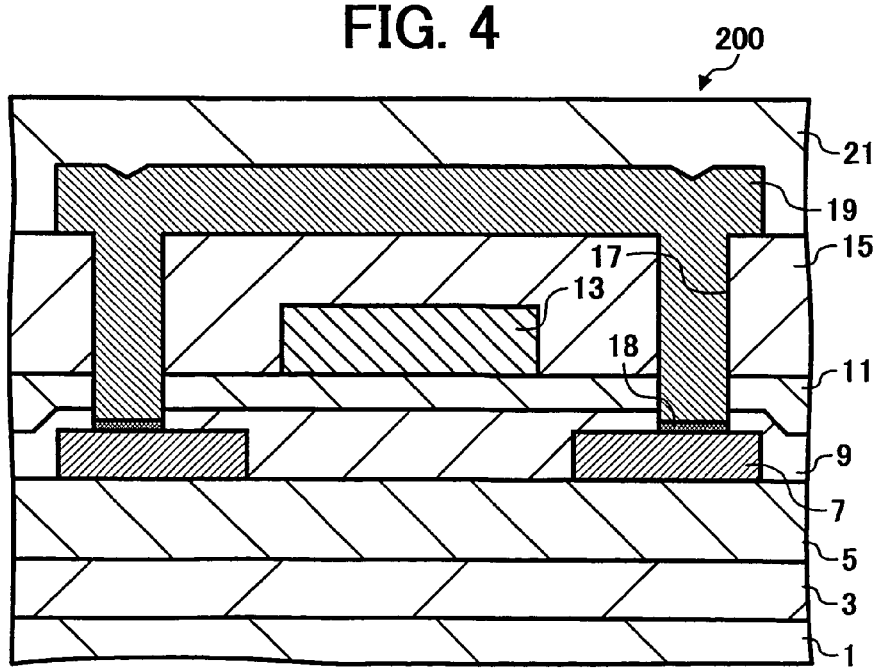
FIG. 4 is a schematic cross-section view of a major portion of the semiconductor apparatus of FIG. 3.

As shown in FIG. 4, the semiconductor apparatus 200 is provided with a semiconductor substrate 1 covered by a base insulating film 3 made of a silicon dioxide film on which a lower insulating layer 5 comprising a BPSG film, for example, is formed. The lower insulating layer 5 is provided with a plurality of lower conductive film strips 7 thereon. The lower conductive film strips 7 are made of an alloy of aluminum, silicon, and copper, including a Si of 1 w % (mass percent) and a Cu of 0.5 w %, and have a thickness of 3 μm and a line width of 4 μm, for example. As shown in FIG. 3, the lower conductive film strips 7 are arranged in a pattern closely adjacent and parallel to one another in a line width orientation, while every adjacent two of the lower conductive film strips 7 are electrically separated from each other. A space between the adjacent two lower conductive film strips 7 is 4 μm, for example.

The lower insulating layer 5 and the lower conductive film strips 7 are covered by a passivation film formed by a chemical vapor deposition method (CVD), for example. The passivation film includes a PSG film 9 as a lower layer having a thickness of 4,000 angstroms, for example, and a SiN film 11 as an upper layer having a thickness of 12,000 angstroms, for example. The PSG film 9 and the SiN film 11 are two of the inter-layer insulating layers.

A magnetic member 13 is formed on the SiN film 11 and has a length sufficient to traverse the lower conductive film strips 7, as shown in FIG. 3. The magnetic member 13 has a thickness of 3 μm and a line width of 4 μm, for example. A material of the magnetic member 13 is a Cu—Ni—Co alloy, for example, having a cobalt of 41 w %, a copper of 35 w %, and a nickel of 24 w %, since the Cu—Ni—Co alloy is highly machinable and has a high retentivity. The Cu—Ni—Co alloy is capable of undergoing a cold-work, that is, a plastic forming at a normal temperature or a temperature below a recrystallization temperature, and therefore its formability can be improved. In addition, since the Cu—Ni—Co alloy includes no iron, the Cu—Ni—Co alloy would not reduce reliability when used in a semiconductor apparatus.

The SiN film 11 and the magnetic member 13 are covered with a photosensitive polyimide layer 15 having a thickness of 53,000 angstroms, for example. The photosensitive polyimide layer 15 is another one of the inter-layer insulating layers. As an alternative to the photosensitive polyimide layer 15, a photosensitive polybenz-oxazole layer may be formed.

A through hole 17 is formed in the photosensitive polyimide layer 15, the SiN film 11, and the PSG film 9 at a position on each edge side of each one of the lower conductive film strips 7, having an area of the order of 3 μm×3 μm, for example.

A barrier metal layer 18 made of chromium, for example, is formed on the surface of the lower conductive film 7 at a position at the bottom of each one of the through holes 17. The barrier metal layer 18 prevents mutual invasion between a material such as a copper, for example, filled in the through hole 17 and the Al—Si—Cu alloy of the lower conductive film strip 7.

A plurality of upper conductive film strips 19 having a U-like shape are formed on the photosensitive polyimide layer 15 and in the through holes 17. Each one of the upper conductive film strips 19 connects an edge side of one of the lower conductive film strips 7 to an opposite edge side of adjacent one of the lower conductive film strips 7. Therefore, the upper conductive film strips 19 connect the lower conductive film strips 7 in series, as shown in FIG. 3. The material of the upper conductive film strip 19 comprises a copper, for example. A portion of the copper-comprising upper conductive film strip 19 inside the through hole 17 forms a member of the present invention referred to as an implanted conductive member. A portion of the upper conductive film strip 19 on the photosensitive polyimide layer 15 has a thickness of 3 μm and a line width of 4 μm, for example. Adjacent two of the upper conductive film strips 19 are spaced at a pitch of 4 μm, for example.

The photosensitive polyimide layer 15 and the upper conductive film strips 19 are capsulated with an encapsulation resin 21.

As described above, the lower conductive film strips 7 are arranged in a pattern closely adjacent and parallel to one another in a line width orientation, while every adjacent two of the lower conductive film strips 7 are electrically separated from each other. An edge side of each lower conductive film strip 7 is connected to an opposite edge side of the immediately adjacent lower conductive film strip 7 by one of the upper conductive film strips 19 so that the upper conductive film strips 19 connect the lower conductive film strips 7 in series and, as a result, they form an electric coil as a whole. Inside the electric coil, the magnetic member 13 is arranged to increase density of an electric coil inductance.

This electric coil can be made in an extremely small size since it is prepared with a manufacturing process of semiconductor apparatuses, and its inductance can be increased by an increase of a number of coil turns. Furthermore, the electric coil of the present invention has fewer deviations of turns than those of ordinary electric coils and therefore generates a more stable inductance.

Figure 5:
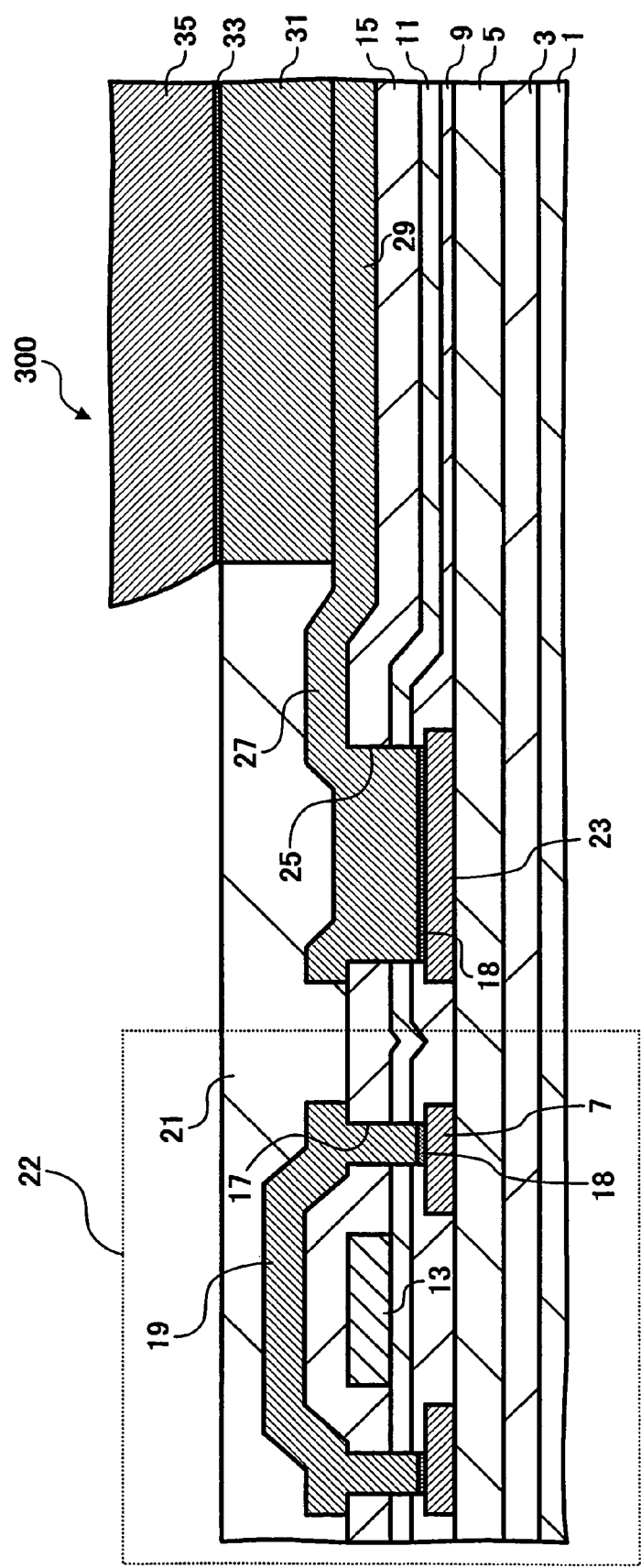
FIG. 5 is a schematic cross-section view of a major portion of a wafer-level CSP according to a preferred embodiment of the present invention.

An exemplary application of the semiconductor apparatus 200 to a wafer-level CSP 300 is shown in FIG. 5. In FIG. 5, reference numeral 22 denotes a portion of the wafer-level CSP 300 corresponding to the semiconductor apparatus 200 shown in FIGS. 3 and 4.

In the wafer-level CSP 300, the semiconductor substrate 1 is covered with the base insulating film 3 which is overlaid by the lower insulating layer 5. In other areas not shown in FIG. 5, semiconductor elements such as transistors are formed under the lower insulating layer 5 and contact holes are prepared in the lower insulating layer 5.

On the lower insulating layer 5, a plurality of the lower conductive film strips 7 are formed, comprising an alloy of aluminum, silicon, and copper (e.g., a silicon of 1 w % and a copper of 0.5 w %) with a thickness of 3 μm and a line width of 4 μm, for example. An Al distribution layer (not shown) comprising aluminum for electrically connecting transistor elements is also formed on the lower insulating layer 5. In addition, an Al electrode pad 23 with a thickness of 3 μm and an area of the order of 100 μm times 100 μm, for example, is formed on the lower insulating layer 5. The Al electrode pad 23 comprises an alloy of aluminum, silicon, and copper including a silicon of 1 w % and a copper of 0.5 w %, for example.

The passivation layer comprising the PSG film 9 as a lower layer and the SiN film 11 as an upper layer is formed on the lower insulating layer 5, the lower conductive film strips 7, the Al distribution layer, and the Al electrode pad 23. The magnetic member 13 is formed on the SiN film 11, with a length sufficient to traverse the lower conductive film strips 7. The photosensitive polyimide layer 15 is formed on the SiN film 11 and the magnetic member 13.

In the photosensitive polyimide layer 15, the SiN film 11, and the PSG film 9, the through holes 17 are vertically formed at positions to face both edge sides of each one of the lower conductive film strips 7 and a pad opening 25 is vertically formed at a position to face the Al electrode pad 23. The through hole 17 has an area of the order of 3 μm×3 μm, for example, facing the surface of the lower conductive film strip 7, and the pad opening 25 has an area of the order of 100 μm×100 μm, for example, facing the surface of the Al electrode pad 23.

The barrier metal layer 18 is formed on the surface of the lower conductive film 7 at a position at the bottom of each one of the through holes 17 and on the surface of the Al electrode pad 23 at a position underneath the bottom of the pad opening 25. The barrier metal layer 18 prevents mutual invasion between a material such as a copper, for example, filled in the through hole 17 and the Al—Si—Cu alloy of the lower conductive film strip 7 and between a material such as a copper, for example, filled in the pad opening 25 and the Al—Si—Cu alloy of the Al electrode pad 23.

A plurality of the upper conductive film strips 15 comprising copper, for example, are formed on the photosensitive polyimide layer 15 and in the through holes 17. In a region other than the region where the upper conductive film strips 19 are formed, a Cu distribution layer 27 and a Cu electrode pad 29 are formed on the photosensitive polyimide layer 15 and in the pad opening 25. The Cu distribution layer 27 and the Cu electrode pad 29 are also referred to as a redistribution layer. The redistribution layer generally comprises copper because it provides high conductivity, high mechanical strength, and high reliability in terms of moisture resistance.

On the Cu electrode pad 29, a metal post 31 comprising copper, for example, is formed. The encapsulation resin 21 is formed on the photosensitive polyimide layer 15, the upper conductive film 19, the Cu distribution layer 27, and the Cu electrode pad 29 such that the surface of the metal post 31 is exposed to air.

A barrier metal layer 33 comprising, from the bottom, a titanium (Ti) layer with a thickness of 1,000 angstroms, for example, a nickel (Ni) layer with a thickness of 4,000 angstroms, for example, and a silver (Ag) layer with a thickness of 1,000 angstroms, for example, is formed on the surface of the metal post 31. With this barrier metal layer 33, a solder sphere 35 serving as an external connection electrode is mechanically adhered to the metal post 31.

In the wafer-level CSP 300, in a wafer-level chip size package, the electric coil comprising the lower conductive film strips 7 and the upper conductive film strips 17 is structured in the region different from the region where the Cu distribution layer 27 and the Cu electrode pad 29 constituting the redistribution layer are formed. Therefore, it becomes possible to form an electric coil without increasing the area of a chip. In addition, the redistribution layer allows a thick connection layer so that the electric coil can have a relatively low electrical resistance and consequently allows a relatively large current to flow.

In the present embodiment, the barrier metal layer 18 comprises chromium and the barrier metal layer 33 comprises the Ti, Ni, and Ag layers. However, the barrier metal layers are not limited to them and can be made of other materials.

Next, a manufacturing procedure of the wafer-level CSP 300 of FIG. 5 is explained with reference to FIGS. 6A–6G and 7A–7G. FIGS. 6A–6G show cross sections of the wafer-level CSP 300 to explain breakdown processes, and FIGS. 7A–7G show top views of to demonstrate how the electric coil is formed through the respective processes.

Figure 6A:
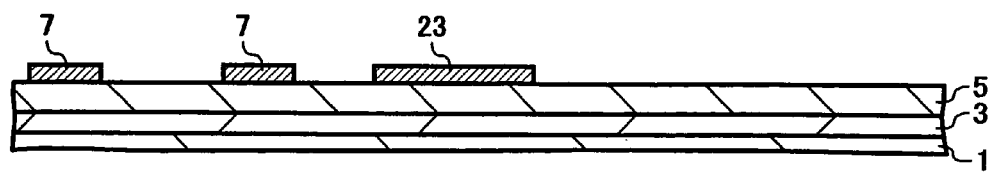
FIGS. 6A–6G are schematic cross-section views of the wafer-level CSP of FIG. 5 corresponding to sequential processes of manufacturing the wafer-level CSP of FIG. 5.
Figure 7A:
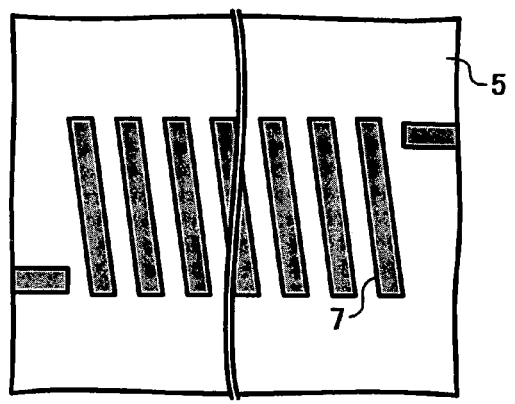
FIGS. 7A–7G are schematic top views of an electric coil portion of the wafer-level CSP corresponding to the sequential processes of manufacturing the wafer-level CSP of FIG. 5.

The first process is shown in FIG. 6A and the corresponding electric coil forming region is shown in FIG. 7A. In this process, the base insulating film 3 and a semiconductor device (not shown), such as a transistor, are formed on the semiconductor substrate 1. Then, the lower insulating layer 5 (i.e., the BPSG film) is formed on the base insulating film 3 relative to the entire region of the semiconductor substrate 1. Then, through holes (not shown) are formed in the lower insulating layer 5. Subsequently, an Al—Si—Cu-alloy layer, including a Si of 1 w % and a Cu of 0.5 w %, is formed to an extent of a thickness of 3 μm on the lower insulating layer 5 relative to the entire region of the semiconductor substrate 1. Then, the Al—Si—Cu-alloy layer is patterned by photoengraving and etching to form a plurality of the lower conductive film strips 7, the Al distribution layer (not shown), and the Al electrode pad 23.

Figure 6B:
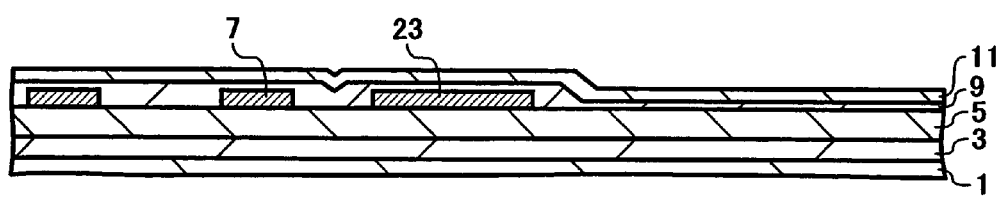
Figure 7B:
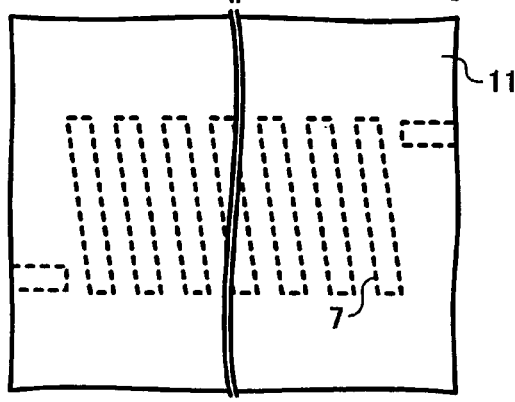

A next process is shown in FIG. 6B and the corresponding electric coil forming region is shown in FIG. 7B. In this process, a passivation film is formed by CVD, for example. The PSG film 9 is formed to an extent of a thickness of 4,000 angstroms on the lower insulating layer 5, the lower conductive film strips 7, and the Al electrode pad 23. Then, the SiN film 11 is formed to an extent of a thickness of 12,000 angstroms on the PSG film 9. Thus, the passivation film comprising the PSG film 9 and the SiN film 11 are prepared.

Figure 6C:
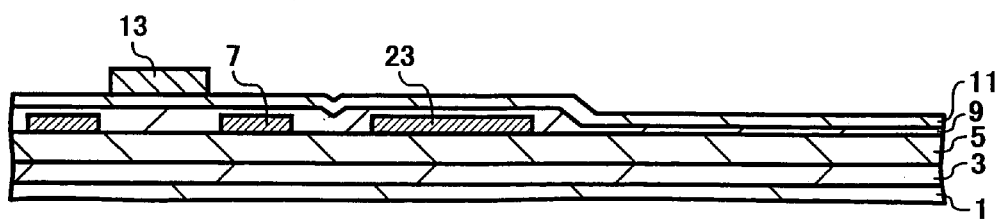
Figure 7C:
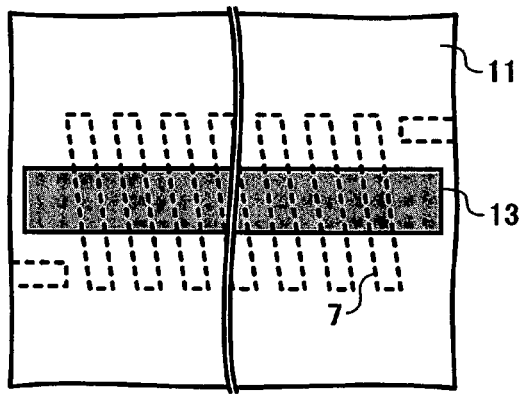

A next process is shown in FIG. 6C and the corresponding electric coil forming region is shown in FIG. 7C. In this process, the magnetic member 13 is formed on the SiN film 11 to an extent of a length sufficient to traverse the lower conductive film strips 7. The magnetic member 13 has a thickness of 3 μm and a line width of 4 μm. The magnetic member 13 comprises a Cu—Ni—Co alloy, having a cobalt of 41 w %, a copper of 35 w %, and a nickel of 24 w %.

Figure 6D:
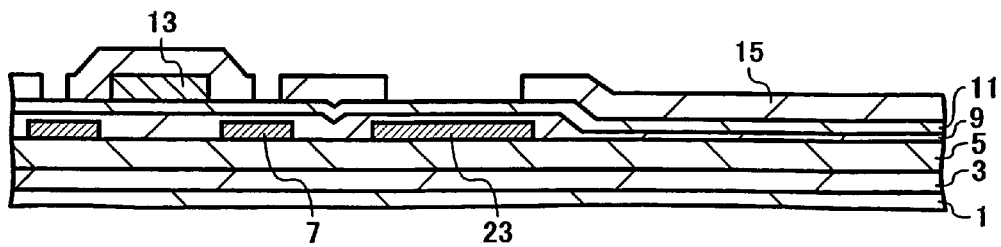
Figure 7D:
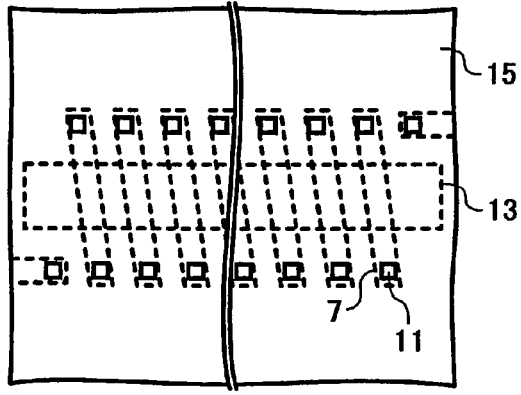

A next process is shown in FIG. 6D and the corresponding electric coil forming region is shown in FIG. 7D. In this process, a positive-type photosensitive polyimide material layer is formed to an extent of a thickness of 53,000 angstroms on the SiN film 11 and the magnetic member 13 by a roll-on coating. The positive-type photosensitive polyimide material layer is subjected to the exposure and development processes so that the openings are formed in the positive-type photosensitive polyimide material layer at the positions above both edge sides of each of the lower conductive film strips 7 and the Al electrode pad 23. Subsequently, the positive-type photosensitive polyimide material layer is subjected to a curing process at a temperature of 320 degrees centigrade, thereby, forming the photosensitive polyimide layer 15.

Figure 6E:
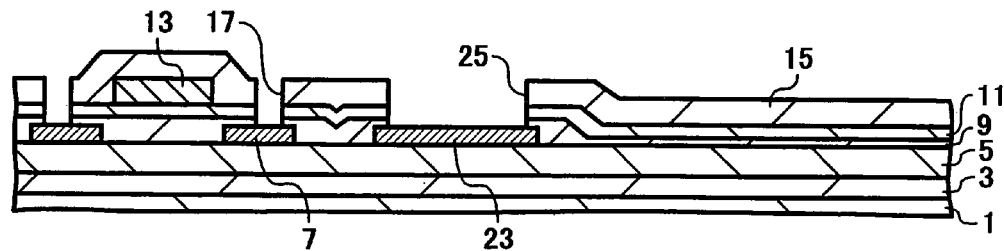
Figure 7E:
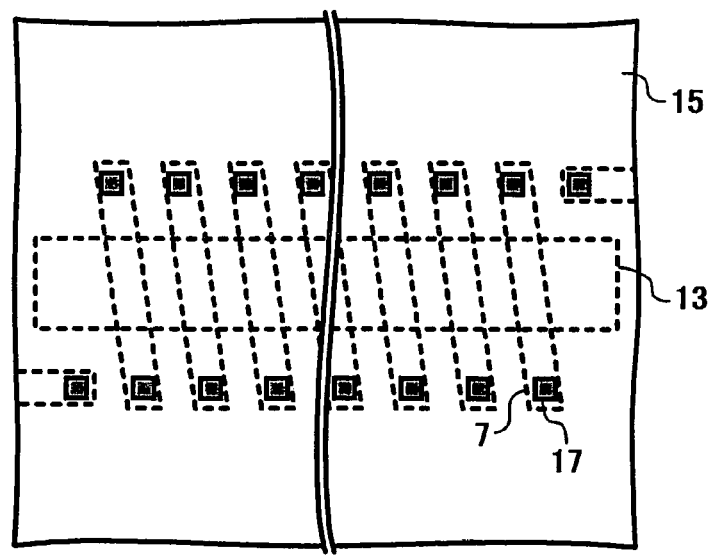

A next process is shown in FIG. 6E and the corresponding electric coil forming region is shown in FIG. 7E. In this process, the SiN film 11 and the PSG film 9 are etched with a mask of the photosensitive polyimide layer 15 so that the through holes 17 are formed in the insulating layer above the lower conductive film strips 7 and the pad opening 25 is formed on the Al electrode pad 23.

Figure 6F:
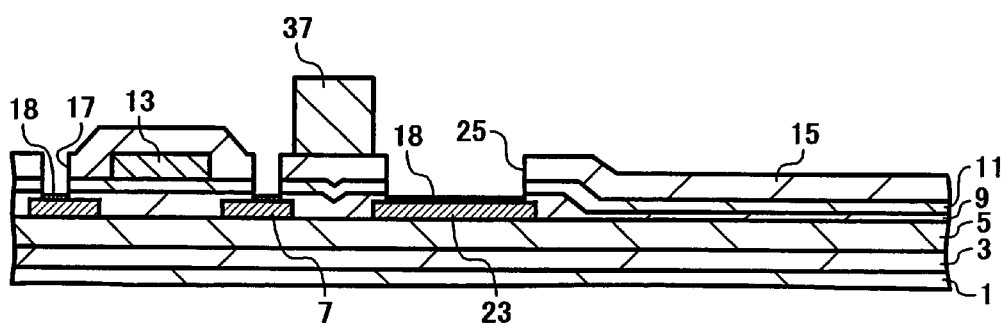
Figure 7F:
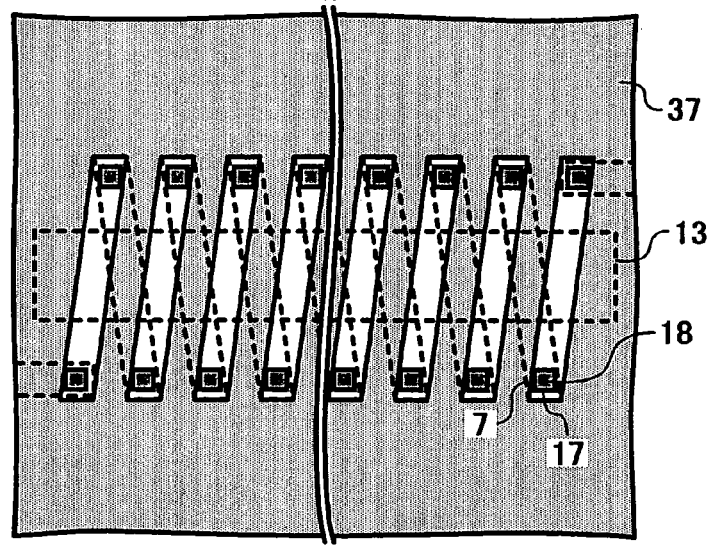

A next process is shown in FIG. 6F and the corresponding electric coil forming region is shown in FIG. 7F. In this process, the barrier metal layer 18 comprising chromium, for example, and the plating electrode layer (not shown) comprising copper, for example, are formed by sputtering deposition on the photosensitive polyimide layer 15 and inside the through holes 17 and the pad opening 25. FIG. 6F shows the barrier metal layer 18 formed above the surface of the lower conductive film strips 7 corresponding to the bottom of the through holes 17 and above the surface of the Al electrode pad 23 corresponding to the bottom of the pad opening 25, but it does not show the one formed in other regions. In the regions where the redistribution layer is not formed, a dry film resist pattern 37 is formed on the plating electrode layer.

Figure 6G:
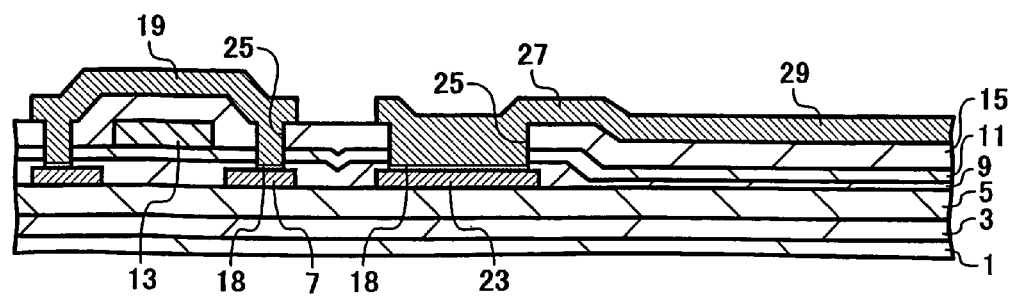
Figure 7G:
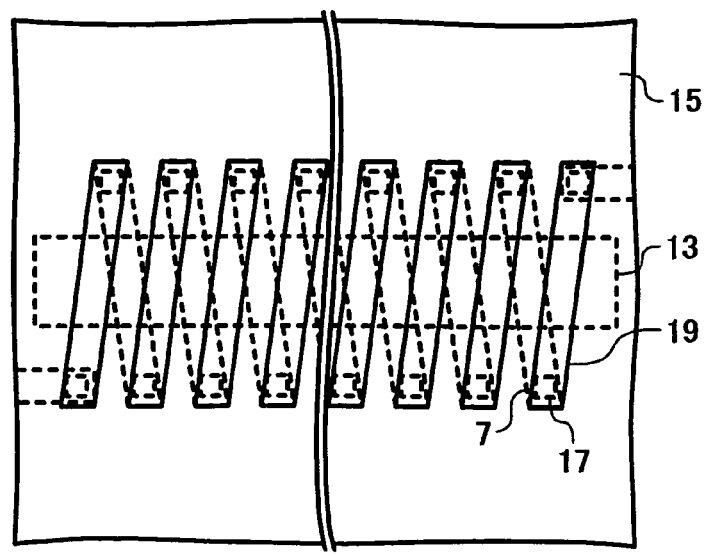

A next process is shown in FIG. 6G and the corresponding electric coil forming region is shown in FIG. 7G. In this process, a Cu layer is formed on the photosensitive polyimide layer 15 and inside the through holes 17 and the pad opening 25, with an electrolytic plating, so that the upper conductive film strips 19, the Cu distribution layer 27 and the Cu electrode pad 29, which are the redistribution layer, are formed. After that, the dry film resist pattern 37 is removed and then unnecessary portions of the plating electrode layer and the barrier metal layers are removed by wet etching with masks of the Cu distribution layer 27 and the Cu electrode pad 29.

After the process of forming the Cu distribution layer 27 and the Cu electrode pad 29, a Cu layer is formed by sputtering deposition and electrolytic plating. Then, the Cu layer is patterned by photoengraving and etching to form the metal post 31 on the Cu electrode pad 29. After that, the wafer, the encapsulation resin, and a temporally film are placed in a mold tool for the encapsulation with resin. Then, heat and pressure are applied to the mold tool to an extent that the metal post 31 is projected from the encapsulating resin 21. Consequently, the encapsulation resin is formed on the photosensitive polyimide layer 15, the Cu distribution layer 27, and the Cu electrode pad 29. Then, the barrier metal layer 33 is formed on the surface of the metal post 31. Subsequently, the solder sphere 35 is mechanically fixed to the metal post 31 through the barrier metal layer 33, as shown in FIG. 5.

Finally, the semiconductor substrate 1 is divided into individual chips by a scribing process so that a wafer-level CSP is obtained. Thus, the wafer-level CSP 300 of FIG. 5 is prepared.

In the above-described procedure, the upper conductive film strips 19 forming parts of the electric coil is formed at the same time as the Cu distribution layer 27 and the Cu electrode pad 29 are formed. Using the same material as the Cu distribution layer 27 and the Cu electrode pad 29, the procedure is accordingly simplified. In addition, since the electric coil is formed in a region separated from those of the redistribution layer, the area of the chip is not necessarily increased. Further, since the redistribution layer allows a relatively thick distribution, it is possible to provide the electric coil with a relatively low electrical resistance to flow a relatively large current.

Figure 8:
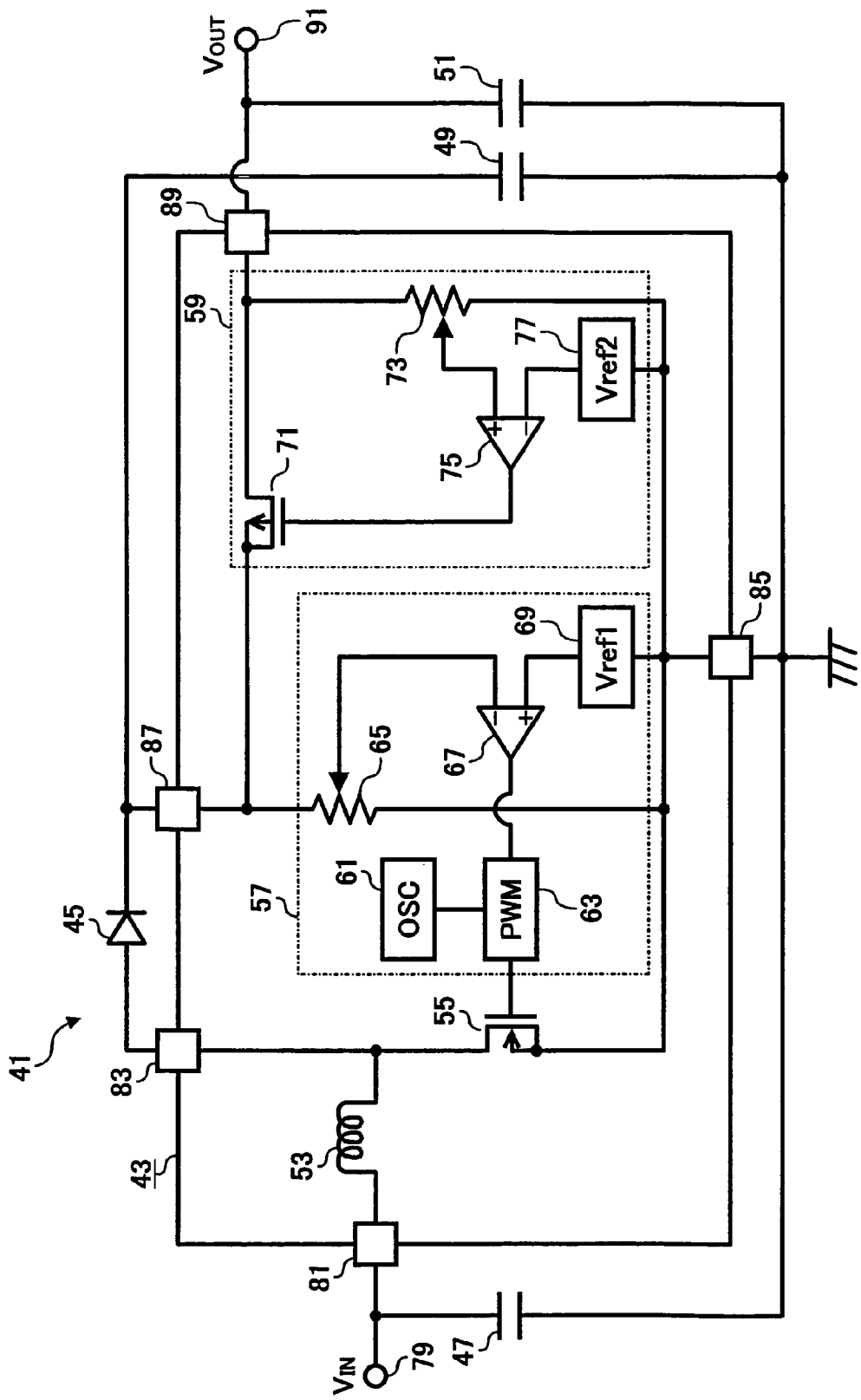
FIG. 8 is a schematic circuit diagram of a step-up DC-DC converter according to a preferred embodiment of the present invention.

Next, an exemplary step-up DC-DC converter 41 including the above-described semiconductor apparatus having the electric coil according to the present invention is explained with reference to FIG. 8. As shown in FIG. 8, the step-up DC-DC converter 41 includes an IC component 43, a Schottky diode 45, and capacitors 47, 49, and 51. A circuit board (not shown) is also included to mount and electrically connect these and other electrical components.

The IC component 43 includes an electric coil 53, a switch 55, a control circuit 57, and a voltage regulating circuit 59. The switch 55 is an N-channel FET. The control circuit 57 controls the switching operations of the switch 55. The voltage regulating circuit 59 regulates an output voltage to a constant voltage.

The control circuit 57 includes an oscillating circuit (OSC) 61, a pulse width modulation (PWM) circuit 63, a variable resistor 65, a differential amplifier 67, and a reference voltage generating circuit (Vref1) 69. The oscillating circuit 61 determines an initial time ratio of the switch 55. The differential amplifier 67 compares a divided voltage obtained by a division of an DC-DC converter's output with the variable resistor 65 with a reference voltage generated by the reference voltage generating circuit 69. After comparing the two voltages, the differential amplifier 67 amplifies a voltage difference and outputs an amplified voltage difference to the pulse width modulation circuit 63. The pulse width modulation circuit 63 adjusts the time ratio of the switch 55 based on the voltage difference from the differential amplifier 67 to suppress the voltage difference.

The voltage regulating circuit 59 includes an output driver 71, a variable resistor 73, a differential amplifier 75, and a reference voltage generating circuit (Vref2) 77. The output driver 71, which is a P-channel FET, receives a DC-DC converter output as an input voltage and makes its output voltage constant through an active resistant value of the P-channel FET, which is activated when the P-channel FET is turned on. The differential amplifier 75 compares a divided voltage obtained by dividing the voltage regulating circuit's output with the variable resistor 73 by a reference voltage generated by the reference voltage generating circuit 77. Based the resulting voltage difference, the active resistant value of the output driver 71 is adjusted to suppress the voltage difference.

In the structure of the IC component 43, one end of the electric coil 53 is connected to an electric coil input terminal 81 connected to an input terminal (Vin) 79 of the DC-DC converter 41. The other end of the electric coil 53 is connected to a switch output terminal 83, which in turn is connected to the Schottky diode 45 which is an externally connected component. The switch 55 is connected between a line connecting the electric coil 53 to the switch output terminal 83 and a grounding terminal 85 connecting to a grounding. The gate of the switch 55 is connected to the pulse width modulation circuit 63 of the control circuit 57.

A step-up output terminal 87, to which the Schottky diode 45 is connected, is connected to the variable resistor 65 of the control circuit 57 and to the output driver 71 of the voltage regulating circuit 59. The voltage input from the Schottky diode 45 to the step-up output terminal 87 is an output of the DC-DC converter composed of the Schottky diode 45, the electric coil 53, the switch 55, and the control circuit 57, and is also an input to the voltage regulating circuit 59. The output from the output driver 71 of the voltage regulating circuit 59 is connected to an output terminal 89.

The output terminal 89 is connected to an output terminal (Vout) 91 of the DC-DC converter 41. The switch output terminal 83 and the step-up output terminal 87 are connected to the Schottky diode 45. A wiring between the input terminal 79 and the electric coil input terminal 81 is grounded through the capacitor 47. A wiring between the Schottky diode 45 and the step-up output terminal 87 is grounded through the capacitor 49. A wiring between the output terminals 89 and 91 is grounded through the capacitor 51.

As described above, the step-up DC-DC converter 41 controls the switching operations of the switch 55 with the control circuit 57. When the switch 55 is turned on the step-up DC-DC converter 41 charges an energy in the electric coil 55 based on the input voltage from the input terminal 79. When the switch 55 is turned off it discharges the energy from the electric coil 55 by overlaying the energy on the input voltage. An output voltage higher than the input voltage is then output via the switch output terminal 83 and the Schottky diode 45, and is subsequently input to the voltage regulating circuit 59 via the step-up output terminal 87 in which the output voltage is regulated at a constant value. Then, the regulated step-up output voltage is output from the output terminal 91 via the output terminal 89.

According to the present embodiment, the electric coil of the DC-DC converter which is conventionally an externally-mounted component is made as one of built-in elements of the IC component. Therefore, the DC-DC converter is made thin and small. Moreover, the number of components constituting the DC-DC converter can be reduced and accordingly the manufacturing procedure can be simplified. In addition, since the process of mounting the electric coil which is required in the conventional procedure is eliminated, a packaging reliability can be increased.

The semiconductor apparatus according to the present invention has unlimited applications to the step-up DC-DC converter. The semiconductor apparatus of the present invention may also be applied to a step-down DC-DC converter, or a step-up-and-down DC-DC converter. Further, the electronic device to which the semiconductor apparatus of the present invention is applied is not limited to the DC-DC converter but can be applied to other electronic device employing an electric coil.

Figure 9:
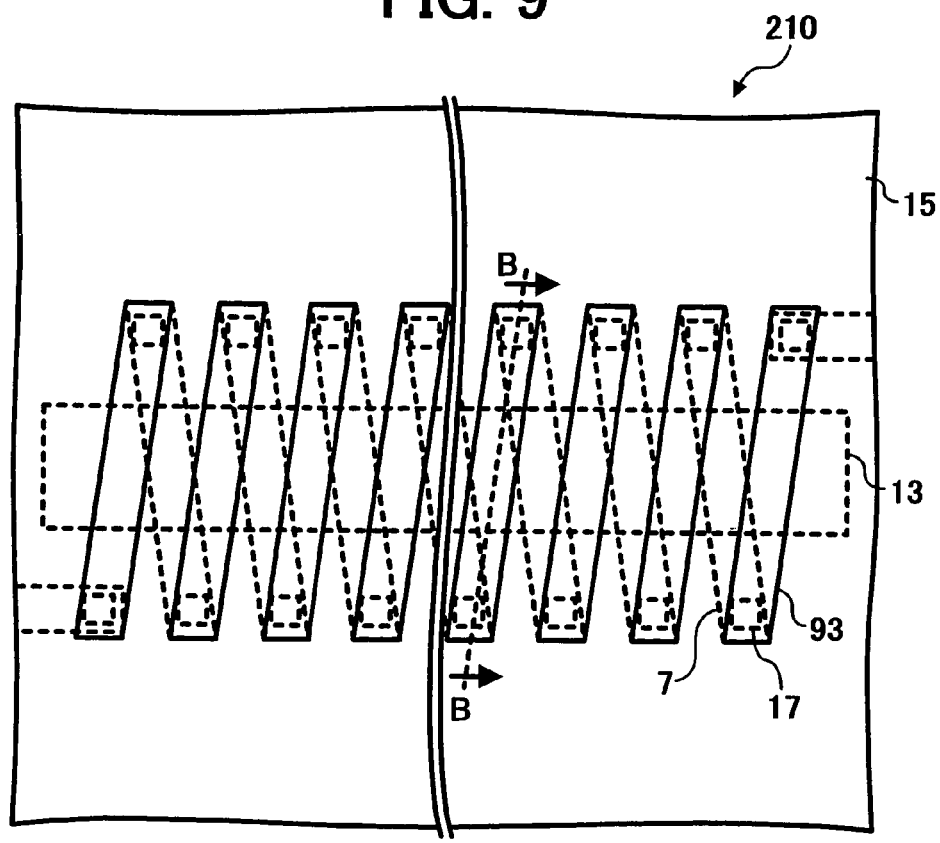
FIGS. 9 and 10 show a semiconductor apparatus according to another embodiment of the present invention.
Figure 10:
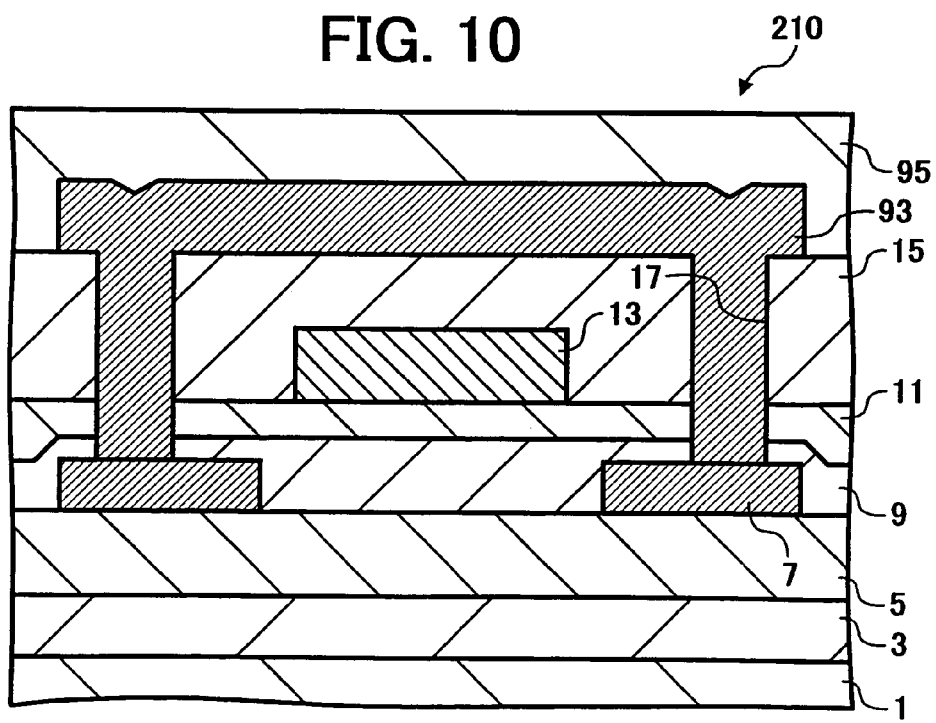

Next, a semiconductor apparatus 210 according to another embodiment of the present invention is explained with reference to FIGS. 9 and 10. FIG. 9 shows an electric coil portion of the semiconductor apparatus 210 and FIG. 10 shows a cross section of the semiconductor apparatus 210 taken on line B—B of FIG. 9. In FIGS. 9 and 10, the elements identical to those already shown in FIGS. 3 and 4 are labeled with the same reference numerals.

As shown in FIG. 10, the semiconductor substrate 1 is covered with the base insulating film 3 on which the lower insulating layer 5 is formed. The lower insulating layer 5 is provided with a plurality of the lower conductive film strips 7 thereon. The lower conductive film strips 7 comprise an alloy of aluminum, silicon, and copper, including a Si of 1 w % (mass percent) and a Cu of 0.5 w %, and have a thickness of 3 μm and a line width of 4 μm, for example. As shown in FIG. 9, the lower conductive film strips 7 are arranged in a pattern closely adjacent and parallel to one another in a line width orientation, while every adjacent two of the lower conductive film strips 7 are electrically separated from each other. A space between the adjacent two lower conductive film strips 7 is 4 μm, for example.

The lower insulating layer 5 and the lower conductive film strips 7 are covered by a passivation film including the PSG film 9 as a lower layer and the SiN film 11 as an upper layer. The magnetic member 13 is formed on the SiN film 11 and has a length sufficient to traverse the lower conductive film strips 7, as shown in FIG. 9. The SiN film 11 and the magnetic member 13 are covered with the photosensitive polyimide layer 15. The through hole 17 is formed in the photosensitive polyimide layer 15, the SiN film 11, and the PSG film 9 at a position on each edge side of each one of the lower conductive film strips 7.

A plurality of the upper conductive film strips 93 having a U-like shape are formed on the photosensitive polyimide layer 15 and in the through holes 17. Each one of the upper conductive film strips 93 connects an edge side of one of the lower conductive film strips 7 to an opposite edge side of adjacent one of the lower conductive film strips 7. Therefore, the upper conductive film strips 93 connect the lower conductive film strips 7 in series, as shown in FIG. 9. In this embodiment, the upper conductive film strip 93 comprises the same materials as the lower conductive film strips 7, that is, the Al—Si—Cu alloy including a Si of 1 w % and a Cu of 0.5 w %. A portion of the Al—Si—Cu-alloy-made upper conductive film strip 93 inside the through hole 17 forms a member of the present invention referred to as an implanted conductive member. A portion of the upper conductive film strip 93 on the photosensitive polyimide layer 15 has a thickness of 3 μm and a line width of 4 μm, for example. Adjacent two of the upper conductive film strips 93 are spaced at a pitch of 4 μm, for example. The photosensitive polyimide layer 15 and the upper conductive film strips 93 are capsulated with an insulating layer 95.

In this embodiment, the semiconductor apparatus 210 is provided with an electric coil made of the lower conductive film strips 7 and the upper conductive film strips 93. Since the lower conductive film strips 7 and the upper conductive film strips 93 are made of the same materials, it becomes unnecessary to provide the barrier metal layer to prevent the mutual invasion between different metals inside the through holes 17. As a result, the structure of the electric coil is made simple and therefore the manufacturing procedure is simplified.

An exemplary manufacturing procedure of the above-described semiconductor apparatus 210 is explained below. In a first process, the base insulating film 3 is formed on the semiconductor substrate 1 and the lower insulating layer 5 is formed on the base insulating film 3 relative to the entire region of the semiconductor substrate 1. Then, using sputtering deposition, the Al—Si—Cu-alloy layer including a Si of 1 w % and a Cu of 0.5 w % is formed to an extent of a thickness of 3 μm on the lower insulating layer 5 relative to the entire region of the semiconductor substrate 1. Subsequently, the Al—Si—Cu-alloy layer is patterned by photo-engraving and etching to form a plurality of the lower conductive film strips 7.

In a next process, the PSG film 9 is formed on the lower insulating layer 5 and the lower conductive film strips 7. Then, the SiN film 11 is formed on the PSG film 9.

In a next process, the magnetic member 13 is formed on the SiN film 11 to an extent of a length sufficient to traverse the lower conductive film strips 7.

In a next process, the photosensitive polyimide layer 15 having the openings at the positions above both edge sides of each of the lower conductive film strips 7 is formed on the SiN film 11 and the magnetic member 13.

In a next process, the SiN film 11 and the PSG film 9 are etched with a mask of the photosensitive polyimide layer 15 so that the through holes 17 are formed in the insulating layer above the lower conductive film strips 7.

In a next process, the Al—Si—Cu-alloy layer, including a Si of 1 w % and a Cu of 0.5 w % and having a thickness of 3 μm, is formed with the sputtering deposition, for example, on the photosensitive polyimide layer 15 and inside the through holes 17. Then, the Al—Si—Cu-alloy layer is patterned with the photoengraving technique and the etching technique to form the upper conductive film strips 93.

Then, in a next process, the insulating layer 21 is formed on the photosensitive polyimide layer 15 and the upper conductive film strips 93.

In the present embodiment, the lower conductive film strips 7 and the upper conductive film strips 93 comprise the same materials, and therefore it becomes unnecessary to provide a barrier metal layer to prevent the mutual invasion between different metals inside the through holes 17. As a result, the structure of the electric coil is made simple and therefore the manufacturing procedure is simplified.

The electric coil of the present embodiment comprises the upper conductive film strips and the implanted conductive members which are made of the same materials as the upper conductive film strips. However, the present invention is not limited to it. The upper conductive film strips and the implanted conductive members may be made of different materials.

Figure 11:
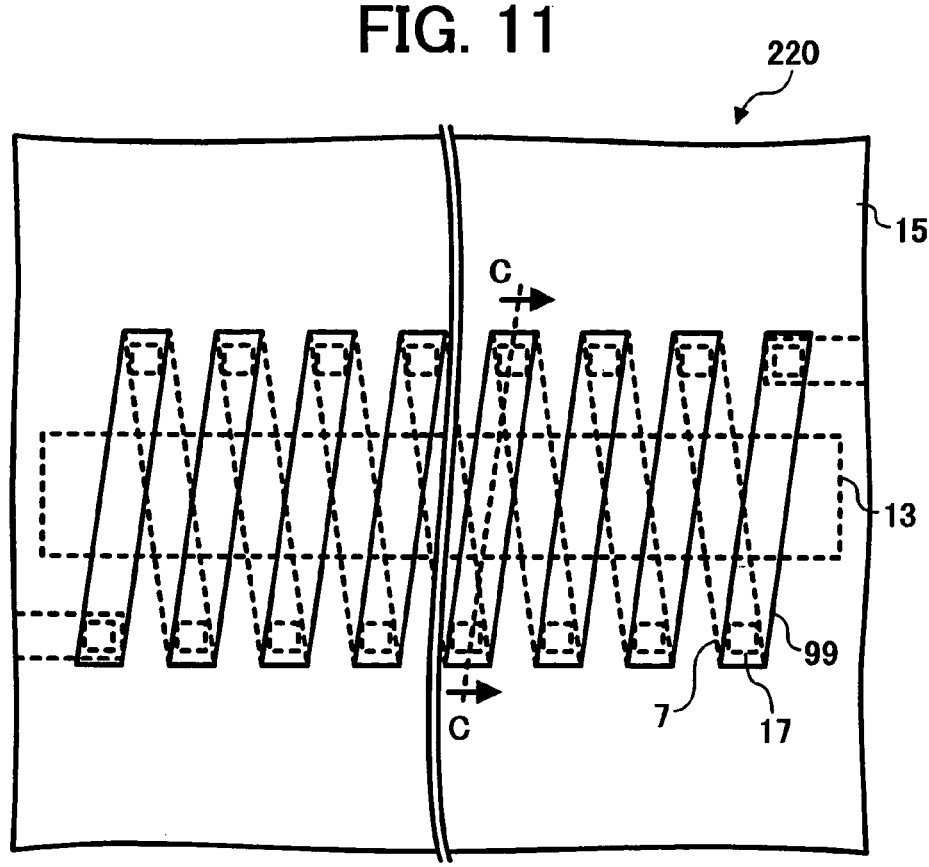
FIGS. 11 and 12 show a semiconductor apparatus according to another embodiment of the present invention.
Figure 12:
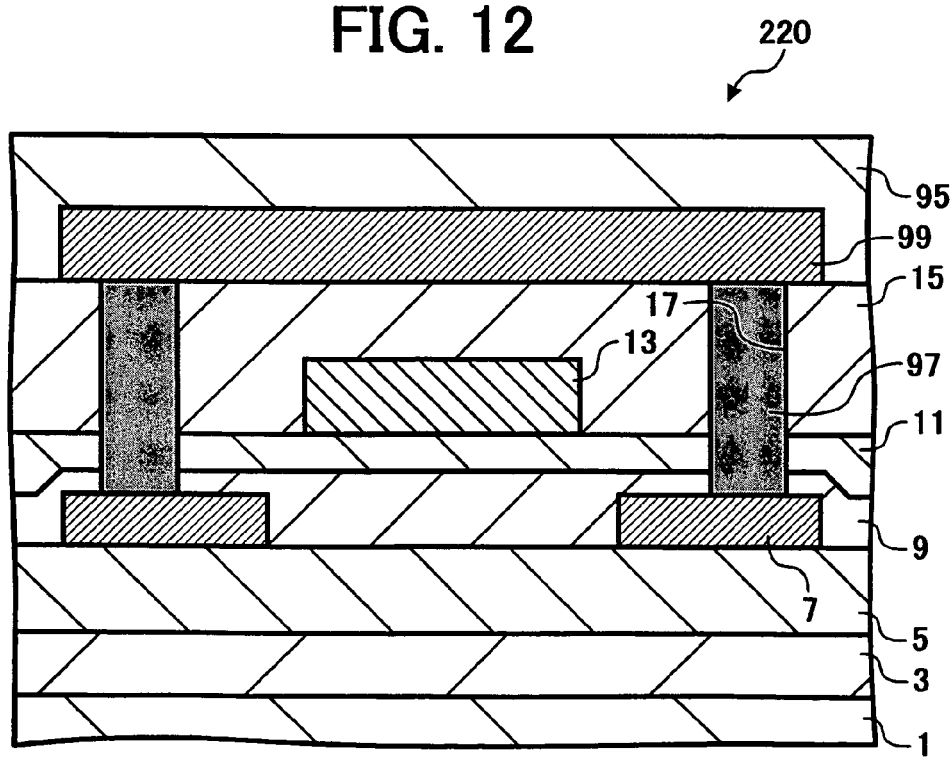

Referring to FIGS. 11 and 12, a description is provided for a semiconductor apparatus 220 employing the upper conductive film strips and the implanted conductive members comprising different materials. FIG. 11 shows an electric coil portion of the semiconductor apparatus 220 and FIG. 12 shows a cross section of the semiconductor apparatus 220 taken on line C—C of FIG. 11. In FIGS. 11 and 12, the elements identical to those already shown in FIGS. 3 and 4 and 9 and 10 are labeled with the same reference numerals.

As shown in FIG. 11, the semiconductor substrate 1 is provided thereon with the base insulating film 3, the lower insulating layer 5, the PSG film 9, the SiN film 11, the magnetic member 13, the photosensitive polyimide layer 15, and the though holes 17. The lower conductive film strips 7 comprise an Al—Si—Cu alloy, including a Si of 1 w % and a Cu of 0.5 w %, and have a thickness of 3 μm and a line width of 4 μm, for example. As shown in FIG. 11, the lower conductive film strips 7 are arranged in a pattern closely adjacent and parallel to one another in a line width orientation, while every adjacent two of the lower conductive film strips 7 are electrically separated from each other. A space between the adjacent two lower conductive film strips 7 is 4 μm, for example.

Each of the through holes 17 is filled with a tungsten so that a tungsten plug 97 is formed. The tungsten plug 97 may be referred to as an implanted conductive member.

A plurality of upper conductive film strips 99 having a U-like shape are formed on the photosensitive polyimide layer 15 and the tungsten plug 97. Each one of the upper conductive film strips 99 connects an edge side of one of the lower conductive film strips 7 to an opposite edge side of adjacent one of the lower conductive film strips 7. Therefore, the upper conductive film strips 99 connect the lower conductive film strips 7 in series, as shown in FIG. 11. In this embodiment, the upper conductive film strip 99 comprises, for example, the Al—Si—Cu alloy including a Si of 1 w % and a Cu of 0.5 w %. The upper conductive film strip 99 has a thickness of 3 μm and a line width of 4 μm, for example, and adjacent two of the upper conductive film strips 99 are spaced at a pitch of 4 μm, for example. The photosensitive polyimide layer 15 and the upper conductive film strips 99 are covered with the insulating layer 95.

In the present embodiment, the electric coil is formed with the lower conductive film strips 7, the tungsten plugs 97, and the upper conductive film strips 99. Thus, it is possible to form an electric coil using the upper conductive film strips and the implanted conductive members comprising materials different from each other.

In the above-described semiconductor apparatuses and in the methods of manufacturing these semiconductor apparatuses, the magnetic member disposed in the electric coil is applied without limitation to the materials of the Cu—Ni—Co alloy, including a copper of 41 w %, a nickel of 35 w %, and a cobalt of 24 w %. For example, such magnetic member may be made of any one of various soft ferrite materials such as a manganese-zinc alloy, a nickel-zinc alloy, etc., various amorphous alloy such as a cobalt alloy, a ferrum alloy, etc., and various metal soft-magnetic substances obtained by a crystallization based on an amorphous alloy and having a super-microscopic structure based, such as a soft-magnetic substance, a silicon steel mainly inclusive of a silicon, a Ni—Fe ferromagnetic alloy (e.g., PERMALLOY), a Fe—Co—V alloy (e.g., PERMENDUR), and an Fe—Si—Al alloy (e.g., Sendust).

Further, in the above-described examples, the magnetic member is disposed without limitation inside the electric coil. The magnetic member may be disposed at a place other than the place inside the electric coil.

In addition, the above-described examples use the photosensitive polyimide layer as the uppermost layer of the inter-layer insulating layers without limitation. For example, a polybenz-oxazole layer may be used in place of the photosensitive polyimide layer. Also, the inter-layer insulating layer between the lower and upper conductive film strips is not limited to the one described above but may be a single insulating layer or a multi-layered insulating layer made of a plurality of different insulating layers.

Further, the lower conductive film strips may comprise any one of metal materials such as an Al—Si alloy including an aluminum of 1 w %, an Al—Cu alloy including a copper of 1 w %, an Al—Cu alloy including a copper of 2 w %, and a copper. When the lower conductive film strips made of copper is applied, it is preferable to sandwich the lower and upper layers of the lower conductive film strips in order to prevent an invasion of copper into the lower conductive film strips and the inter-layer insulating film.

Further, the above-described embodiments are directed without limitation to the semiconductor apparatuses that have a single-layered metal distribution structure. The embodiments of the present invention may be applied to other type of semiconductor apparatuses such as one having a multi-layered metal distribution structure.

Numerous additional modifications and variations are possible in light of the above teachings. It is therefore to be understood that within the scope of the appended claims, the disclosure of this patent specification may be practiced other than as specifically described herein.

This patent specification is based on Japanese patent application, No. JPAP2002-001837 filed on Jan. 8, 2002 in the Japanese Patent Office, the entire contents of which are incorporated by reference herein.

What is claimed is:

1. A method of manufacturing a semiconductor device, comprising the steps of:

providing a semiconductor substrate covered with a base insulating film;

coating a lower insulating layer on the base insulating film;

forming a plurality of lower conductive film strips over the lower insulating layer in a pattern closely adjacent and parallel to one another in a line width orientation, every adjacent two of the lower conductive film strips being electrically separated from each other;

forming an inter-layer insulating layer on the lower insulating layer and the plurality of lower conductive film strips;

forming a plurality of connection holes in the inter-layer insulating layer at positions corresponding to both edge sides of each one of the plurality of lower conductive film strips;

forming a plurality of implanted conductive members implanted in the plurality of connection holes; and forming a plurality of upper conductive film strips on the plurality of implanted conductive members and the inter-layer insulating layer to connect an edge side of each one of the plurality of the lower conductive film strips to an opposite edge side of adjacent one of the plurality of the lower conductive film strips through each one of the plurality of the implanted conductive members so that the plurality of lower conductive film strips are connected in series, wherein the plurality of lower conductive film strips, the plurality of implanted conductive members, and the plurality of upper conductive film strips form an electric coil.

2. A method as defined in claim 1, wherein the step of forming the inter-layer insulating layer includes a sub-step of forming a magnetic member in the inter-layer insulating layer to an extent of a length covering the plurality of lower conductive film strips, said inter-layer insulating layer being a multi-layered film including at least different two insulating layers.

3. A method as defined in claim 1, wherein the steps of forming the inter-layer insulating layer includes sub-steps of forming a silicon dioxide film, a silicon nitride film, and a photosensitive polyimide layer, in this order.

4. A method as defined in claim 3, wherein the step of forming the inter-layer insulating layer includes a sub-step of forming a magnetic member on the silicon nitride film to an extent of a length to cover the plurality of lower conductive film strips.

5. A method as defined in claim 4, wherein the magnetic member is made of materials including no ferrum.

6. A method as defined in claim 1, wherein the step of forming the inter-layer insulating layer includes sub-steps of forming a silicon dioxide film, a silicon nitride film, and a photosensitive polybenz-oxazole layer, in this order.

7. A method as defined in claim 1, wherein the plurality of implanted conductive members formed in the step of forming the plurality of implanted conductive members and the plurality of upper conductive film strips formed in the step of forming the plurality of upper conductive film strips are made of a same metal material.

8. A method as defined in claim 1, wherein the plurality of implanted conductive members formed in the step of forming the plurality of implanted conductive members and the plurality of upper conductive film strips formed in the step of forming the plurality of upper conductive film strips are made of a same metal material as the plurality of lower conductive film strips formed in the step of forming the plurality of lower conductive film strips.

9. A method as defined in claim 1, further comprising the steps of:

forming a metal electrode pad formed on the lower insulating layer in a region different from a region where the electric coil is formed, at a same time when the plurality of lower conductive film strips are formed by the step of forming the plurality of lower conductive film strips;

forming the inter-layer insulating layer on the metal electrode pad at a same time when the inter-layer insulating layer is formed by the step of forming the inter-layer insulating layer on the lower insulating layer and the plurality of lower conductive film strips;

forming an opening in the inter-layer insulating layer above the metal electrode pad at a same time when the plurality of connection holes are formed in the inter-layer insulating layer at the positions corresponding to both edge sides of each one of the plurality of lower conductive film strips; and forming a redistribution layer filling the opening formed in the inter-layer insulating layer above the metal electrode pad and laying on the inter-layer insulating layer at a region different from the region where the electric coil is formed, at a same time when the plurality of implanted conductive members are formed by the step of forming the plurality of implanted conductive members and the plurality of upper conductive film strips are formed by the step of forming the plurality of upper conductive film strips.

* * * * *